(12) United States Patent
Lee et al.

(10) Patent No.: US 8,461,662 B2
(45) Date of Patent: Jun. 11, 2013

(54) CARBON/EPOXY RESIN COMPOSITION, AND CARBON-EPOXY DIELECTRIC FILM PRODUCED BY USING THE SAME

(75) Inventors: Eun-Sung Lee, Seoul (KR); Jin-Young Bae, Seoul (KR); Yoo-Seong Yang, Daejeon (KR); Sang-Soo Jee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 273 days.

(21) Appl. No.: 12/710,742

(22) Filed: Feb. 23, 2010

(65) Prior Publication Data

US 2010/0327408 A1 Dec. 30, 2010

(30) Foreign Application Priority Data

Jun. 25, 2009 (KR) .................. 10-2009-0057237

(51) Int. Cl.
*H01L 21/02* (2006.01)

(52) U.S. Cl.
USPC ............ 257/532; 257/E27.009; 257/E27.113; 524/94; 524/403; 524/411; 524/544; 524/394

(58) Field of Classification Search
USPC .................. 257/532, E27.009; 524/394, 544, 524/403, 436, 92, 411
See application file for complete search history.

(56) References Cited

U.S. PATENT DOCUMENTS

| 5,357,005 | A | * | 10/1994 | Buchwalter et al. | 525/436 |
| 6,156,865 | A | * | 12/2000 | Iji | 528/98 |
| 2003/0006402 | A1 | * | 1/2003 | Rao et al. | 252/500 |
| 2009/0054585 | A1 | * | 2/2009 | Ogura et al. | 524/541 |
| 2009/0121195 | A1 | * | 5/2009 | Lee et al. | 252/503 |
| 2011/0052673 | A1 | * | 3/2011 | Tzianabos et al. | 424/450 |

FOREIGN PATENT DOCUMENTS

| JP | 1988-210161 A | 8/1988 |
| JP | 1990-150485 A | 6/1990 |
| JP | 1998-036523 A | 2/1998 |
| JP | 2005-132953 A | 5/2005 |
| KR | 1020050004489 A | 12/2005 |

OTHER PUBLICATIONS

Raj, P. M. et al., Processing and Dielectric Properties of Nanocomposite Thin Film "Supercapacitors" for High-Frequency Embedded Decoupling, IEEE Transactions on Components and Packaging Technologies, vol. 30, No. 4, Dec. 2007.

* cited by examiner

*Primary Examiner* — Eugene Lee
*Assistant Examiner* — Elias M Ullah
(74) *Attorney, Agent, or Firm* — Cantor Colburn LLP

(57) ABSTRACT

A carbon/epoxy composition includes a bisphenol-based epoxy, an amine-based curing agent, an imidazole-based curing catalyst, and carbon black. A carbon-epoxy dielectric layer is fabricated using a reaction product of the carbon/epoxy composition.

13 Claims, No Drawings

CARBON/EPOXY RESIN COMPOSITION, AND CARBON-EPOXY DIELECTRIC FILM PRODUCED BY USING THE SAME

CROSS-REFERENCE TO RELATED APPLICATION

This application claims priority to Korean Patent Application No. 10-2009-0057237, filed on Jun. 25, 2009, and all the benefits accruing therefrom under 35 U.S.C. §119, the content of which in its entirety is herein incorporated by reference.

BACKGROUND

1. Field

This disclosure relates to a carbon/epoxy composition and a method of producing a carbon-epoxy dielectric layer produced using the carbon/epoxy compositions.

2. Description of the Related Art

A passive device, such as a resistor, a capacitor, or an inductor may be embedded in a printed circuit board ("PCB") to decrease the surface area of the board and provide a device having reduced size and weight. In addition, when a passive device is embedded in a PCB, inductance may be decreased, improving electrical performance, and the number of solder joints is decreased, improving the reliability of the device and reducing cost.

An embedded capacitor, which is one example of a passive device, may have a capacitance of 1 picofarad (pF) to 1 microfarad (µF) or more depending upon the application. It is possible to provide a thin capacitor having a high capacitance by using a thin film process such as sputtering, chemical vapor deposition ("CVD") or the like. However, a thin film process has a drawback in that it is difficult to perform at a low temperature, a ceramic thin film is fragile when it is applied to an organic board and the cost of the manufacturing process is high. Therefore, it is difficult to commercialize such a capacitor by applying sputtering or CVD to an organic board, such as an epoxy board, for example an FR-4 board, or a flexible board.

A polymer thick film process is an inexpensive process and is reliable when used with an organic board, but it has a drawback in that the resulting film has low dielectric capacity. Recently, there have been many attempts to overcome the drawbacks of thin film processes, use the merits of thick film processes, and achieve high capacitance by dispersing conductive particles, such as metal or carbon black particles, in a thermosetting polymer matrix and selecting the concentration thereof to be about the percolation threshold.

Currently, a carbon black polymer composite having a high dielectric constant is obtained by including an imidazole-based curing catalyst and carbon black as a conductive material. The imidazole-based catalyst may be poisoned by the carbon black. As the result, the carbon black-polymer composite has a high dielectric constant, but a degree of curing of the polymer matrix is reduced, thus increasing the general dielectric loss ratio and making commercialization difficult.

SUMMARY

An aspect of this disclosure provides a carbon/epoxy composition having a low dielectric loss ratio.

Another aspect of this disclosure provides a carbon-epoxy dielectric layer produced using the carbon/epoxy composition.

A further aspect of this disclosure provides a semiconductor device including the carbon-epoxy dielectric layer.

According to an aspect, feature, and advantage of this disclosure, a carbon/epoxy composition is provided that includes a bisphenol-based epoxy compound, an amine-based curing agent, an imidazole-based curing catalyst, and carbon black.

The carbon/epoxy composition includes about 60 to about 90 weight percent (wt %) of the bisphenol epoxy compound, about 1 to about 30 wt % of the amine-based curing agent, about 0.1 to about 3 wt % of the imidazole-based curing catalyst, and about 1 to about 10 wt % of the carbon black. The amine-based curing agent and the imidazole-based curing catalyst are included at a weight ratio of about 10:1 to about 5:1.

Examples of the bisphenol-based epoxy compound include a bisphenol A epoxy compound, a bisphenol F epoxy compound, a bisphenol AF epoxy compound, or a combination thereof. The bisphenol epoxy compound may be represented by the following Chemical Formula 1.

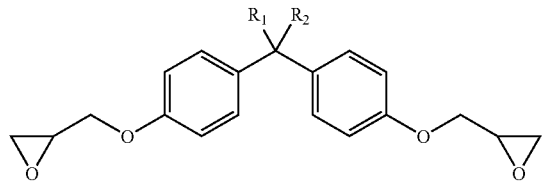

Chemical Formula 1

In the above Chemical Formula 1, $R_1$ and $R_2$ are the same or different and each of $R_1$ and $R_2$ is hydrogen, substituted or unsubstituted alkyl, or hydroxyl (OH). Specifically, each alkyl group can be a substituted or unsubstituted C1 to C6 alkyl group, including wherein each hydrogen of the alkyl group may be partially or fully substituted with fluorine, and even more specifically a substituted or unsubstituted C1 to C3 alkyl group, including wherein each hydrogen of the alkyl group may be optionally partially or fully substituted with fluorine.

The amine-based curing agent may be represented by the following Chemical Formula 2.

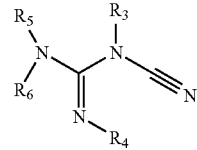

Chemical Formula 2

In the above Chemical Formula 2, $R_3$ to $R_6$ are the same or different, and each is independently hydrogen, a substituted or unsubstituted C1 to C30 alkyl, a substituted or unsubstituted C2 to C30 alkenyl, a substituted or unsubstituted C2 to C30 alkynyl, a substituted or unsubstituted C1 to C30 alkoxy, a substituted or unsubstituted C3 to C30 cycloalkyl, a substituted or unsubstituted C3 to C30 cycloalkenyl, a substituted or unsubstituted C3 to C30 cycloalkynyl, a substituted or unsubstituted C6 to C30 aryl, a substituted or unsubstituted C2 to C30 heteroaryl, a substituted or unsubstituted C6 to C30 arylalkyl, a substituted or unsubstituted C2 to C30 heterocyclic group, or a combination thereof.

The amine-based curing agent may include diethylene triamine ("DETA"), triethylene tetraamine ("TETA"), diethylamino propylamine ("DEAPA"), menthane diamine ("MDA"), N-aminoethyl piperazine ("N-AEP"), meta-xylene diamine ("MXDA"), isophorone diamine ("IPDA"), dicyandiamide ("DICY"), or a combination thereof.

The imidazole-based curing catalyst may include a substituted or unsubstituted C1 to C30 alkyl imidazole, a substituted or unsubstituted C6 to C30 aryl imidazole, a substituted or unsubstituted C7 to C30 arylalkyl imidazole, or a combination thereof. Examples of the imidazole-based curing catalyst include 1-methyl imidazole, 2-methyl imidazole, 2-ethyl-4-methyl imidazole, 2-isopropyl imidazole, 2-undecyl imidazole, 2-heptadecyl imidazole, 1-phenyl imidazole, 2-phenyl imidazole, 2-phenyl-4-methyl imidazole, or a combination thereof.

The carbon/epoxy composition may further include about 10 to about 100 parts by weight of a dispersant based on about 100 parts by weight of the carbon black.

According to another aspect of this disclosure, a carbon-epoxy dielectric layer fabricated using the carbon/epoxy composition is provided.

According to a further aspect of this disclosure, a semiconductor device including the carbon-epoxy dielectric layer is provided. The semiconductor device may be an embedded capacitor.

Hereinafter, further aspects of this disclosure will be described in further detail.

DETAILED DESCRIPTION

The present invention will be described more fully hereinafter in the following detailed description of the invention, in which some but not all embodiments of the invention are described. This invention may be embodied in many different forms and is not to be construed as limited to the embodiments set forth herein; rather, these embodiments are provided so that this disclosure will be thorough and complete and will fully convey the scope of the invention to those skilled in the art.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer, or section from another element, component, region, layer or section. Thus, a first element, component, region, layer, or section discussed below could be termed a second element, component, region, layer, or section without departing from the teachings of the present invention.

The terminology used herein is for the purpose of describing particular embodiments only and is not intended to be limiting. As used herein, the terms "a" and "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, unless otherwise defined, the term "alkyl" refers to a C1 to C30 alkyl, for example a C1 to C20 alkyl or a C1 to C10 alkyl, the term "alkenyl" refers to a C2 to C30 alkenyl, for example a C2 to C20 alkenyl, or a C2 to C10 alkenyl, the term "alkynyl" refers to a C2 to C30 alkynyl, for example a C2 to C20 alkynyl, or a C2 to C10 alkynyl, the term "alkoxy" refers to a C1 to C30 alkoxy, for example a C1 to C20 alkoxy, or a C1 to C10 alkoxy, the term "cycloalkyl" refers to a C3 to C30 cycloalkyl, for example a C3 to C20 cycloalkyl, or a C3 to 010 cycloalkyl, the term "cycloalkenyl" refers to a C3. to C30 cycloalkenyl, for example a C3 to C20 cycloalkenyl, or a C3 to C10 cycloalkenyl, the term "cycloalkynyl" refers to a C3 to C30 cycloalkynyl, for example a C3 to C20 cycloalkynyl, or a C3 to 010 cycloalkynyl, the term "aryl" refers to a C6 to C30 aryl, for example a C6 to C20 aryl or a C6 to C10 aryl, the term "heteroaryl" refers to a C2 to C30 heteroaryl, for example a C2 to C20 heteroaryl, or a C2 to C10 heteroaryl, the term "arylalkyl" refers to a C7 to C30 arylalkyl, for example a C7 to C20 arylalkyl or a C7 to 010 arylalkyl, and the term "heterocyclic group" refers to a C2 to C30 heterocyclic group, for example a C2 to C20 heterocyclic group or a C2 to 010 heterocyclic group. The term "heterocyclic group" refers to a substituted or unsubstituted heterocyclic group including an element of O, S, N, P, Si, or a combination thereof.

As used herein, unless otherwise defined, the term "substituted" refers to a compound or radical substituted with at least one (e.g., 1, 2, 3, 4, 5, 6 or more) substituents independently selected from a halogen (F, Cl, Br or I), hydroxy, nitro, cyano, amino, amidino, hydrazine, or hydrazone, carboxyl, or the like, or a combination thereof, instead of at least one hydrogen, provided that the substituted atom's normal valence is not exceeded.

As used herein, an asterisk (i.e., "*") refers to a point of attachment connecting the same or different atoms or chemical formulas.

A carbon/epoxy composition according to an embodiment includes a bisphenol-based epoxy compound, an amine-based curing agent, an imidazole-based curing catalyst, and carbon black. When the amount of each component of the carbon/epoxy composition is within the forgoing range, a curing reaction occurs to a desired extent, resulting in improved dielectric properties due to reduction of a dielectric loss ratio, and good heat resistance.

The carbon/epoxy composition includes about 60 weight percent (wt %) to about 90 wt %, specifically about 65 wt % to about 85 wt %, more specifically about 50 wt % to about 80 wt % of the bisphenol-based epoxy compound, about 1 wt % to about 30 wt %, specifically 2 wt % to about 25 wt %, more specifically 5 wt % to about 20 wt % of the amine-based curing agent, about 0.1 wt % to about 3 wt %, specifically about 0.2 wt % to about 2 wt %, more specifically about 0.5 wt % to about 1 wt % of the imidazole-based curing catalyst, and about 1 wt % to about 10 wt %, specifically about 2 wt % to about 8 wt %, more specifically about 3 wt % to about 5 wt % of the carbon black. The carbon/epoxy composition may include the amine-based curing agent and the imidazole-based curing catalyst at a weight ratio of about 10:1 to about 5:1, specifically about 9:1 to about 6:1, more specifically about 8:1 to about 7:1. When the amount of each component of the carbon/epoxy composition is within the foregoing range, a curing reaction occurs to a desired extent resulting in improvement of dielectric properties due to reduction of a dielectric loss ratio, and good heat resistance.

While not wanting to be bound by theory, it is understood that because the carbon/epoxy composition includes carbon black, the dielectric constant is higher and the dielectric properties are further improved than in an embodiment without the carbon black.

The carbon/epoxy composition may further include a solvent.

The solvent may be included in an amount sufficient to provide a suitable viscosity so that the carbon/epoxy composition may be used to form a coating.

The carbon/epoxy composition may further include an additive known for use in compositions of this type, for example a dispersant. In an embodiment wherein the dispersant is included, it is possible to control agglomeration of the carbon black to improve dielectric properties.

Hereinafter, the bisphenol-based epoxy compound, the amine-based curing agent, the imidazole-based curing catalyst, the carbon black, and the optional additional additives each component included in the carbon/epoxy composition are further described.

Bisphenol-Based Epoxy Compound

The bisphenol-based epoxy compound is sufficiently cured with an increased degree of curing, and thus the dielectric loss ratio is decreased.

The bisphenol-based epoxy compound has at least two epoxy groups linked to the bisphenol moiety. Examples of the bisphenol-based epoxy compound include a bisphenol A epoxy compound, a bisphenol F epoxy compound, a bisphenol AF epoxy compound, or a combination thereof, but are not limited thereto. The bisphenol epoxy compound may be represented by the following Chemical Formula 1.

Chemical Formula 1

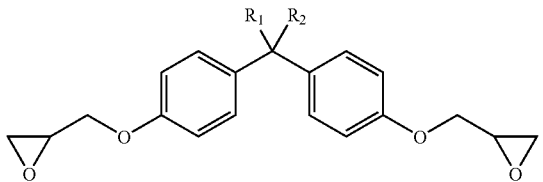

In the above Chemical Formula 1, $R_1$ and $R_2$ are the same or different and each of $R_1$ and $R_2$ is hydrogen, a substituted or unsubstituted alkyl, or hydroxyl (OH). Specifically, each alkyl group can be a substituted or unsubstituted C1 to C6 alkyl group, including wherein each hydrogen of the alkyl group may be partially or fully substituted with fluorine, and even more specifically a substituted or unsubstituted C1 to C3 alkyl group, including wherein each hydrogen of the alkyl group may be optionally partially or fully substituted with fluorine The bisphenol A epoxy compound includes bisphenol A diglycidyl ether ("DGEBA") wherein $R_1$ and $R_2$ are the same and are methyl.

The bisphenol-based epoxy compound may be included in an amount of about 60 wt % to about 90 wt %, in another embodiment about 65 wt % to about 85 wt %, and in another embodiment about 70 wt % to about 80. wt %, based on the total weight of the carbon/epoxy composition. When the bisphenol-based epoxy compound is included within the forgoing range, the carbon-epoxy dielectric layer produced by the carbon/epoxy composition has excellent dielectric properties, particularly low dielectric loss ratio.

Amine-Based Curing Agent

The amine-based curing agent induces a cross-linking reaction of the bisphenol-based epoxy compound to cure the bisphenol-based epoxy compound. In an embodiment, amine-based curing agent is an amine compound.

The amine-based curing agent includes an amine functional group and may have high affinity for carbon black, resulting in a high adherence to carbon black compared with an acid anhydride-based curing agent. For example, the amine-based curing agent may passivate the carbon black. Thereby, when the amine-based curing agent is used along with an imidazole-based curing catalyst, poisoning of the imidazole-based curing catalyst, including poisoning by carbon black, may be substantially reduced or effectively prevented, and a degree of curing of the carbon/epoxy composition may be improved. The carbon/epoxy composition provides a low dielectric loss ratio to improve dielectric properties, and also improve heat resistance.

The amine-based curing agent may be a latent thermal curing agent, and may have a higher curing temperature than an acid anhydride-based curing agent, resulting in a higher curing heat than when an acid anhydride-based curing agent is used. The amine-based curing agent improves a degree of curing, and thus may raise the glass transition temperature ("$T_g$") of the carbon/epoxy composition to provide and excellent heat resistance.

The amine-based curing agent may include a cyano group, and the cyano-containing amine-based curing agent may be represented by the following Chemical Formula 2.

Chemical Formula 2

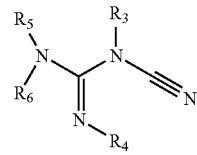

In the above Chemical Formula 2, $R_3$ to $R_6$ are the same or different, and independently are hydrogen, a substituted or unsubstituted C1 to C30 alkyl, a substituted or unsubstituted C2 to C30 alkenyl, a substituted or unsubstituted C2 to C30 alkynyl, a substituted or unsubstituted C1 to C30 alkoxy, a substituted or unsubstituted C3 to C30 cycloalkyl, a substituted or unsubstituted C3 to C30 cycloalkenyl, a substituted or unsubstituted C3 to C30 cycloalkynyl, a substituted or unsubstituted C6 to C30 aryl, a substituted or unsubstituted C2 to C30 heteroaryl, a substituted or unsubstituted C6 to C30 arylalkyl, a substituted or unsubstituted C2 to C30 heterocyclic group, or a combination thereof.

The cyano-containing amine-based curing agent has an amine functional group and a cyano functional group, and in an embodiment provides a synergistic effect in that it has a high affinity for carbon black, resulting in improved adherence to carbon black. When the cyano-containing amine-based curing agent is used in combination with an imidazole-based curing catalyst, a degree of curing of the carbon/epoxy composition may be further improved, and the carbon/epoxy composition may have a low dielectric loss ratio, improved dielectric properties, and improved heat resistance.

The cyano-containing amine-based curing agents may include dicyandiamide ("DICY"), or a combination thereof with other cyano-containing amine-based curing agents, but is not limited thereto.

In another embodiment, the amine-based curing agent may include compounds that do not have a cyano group, for example diethylene triamine ("DETA"), triethylene tetraamine ("TETA"), diethylamino propylamine ("DEAPA"), menthane diamine ("MDA"), N-aminoethyl piperazine ("N-AEP"), meta-xylene diamine ("MXDA"), isophorone diamine ("IPDA"), or a combination thereof, but is not limited thereto.

The amine-based curing agent may include a combination of a cyano-containing amine-based curing agent with an amine-based curing agent that does not have a cyano group.

The amine-based curing agent may be included in an amount of about 1 wt % to about 30 wt %, in another embodiment about 2 wt % to about 20 wt %, and in another embodiment about 5 wt % to about 15 wt %, based on the total weight of the carbon/epoxy composition. When the amine-based curing agent is included within the forgoing range, the bisphenol-based epoxy compound is sufficiently cured, and a carbon-epoxy dielectric layer fabricated using the carbon/epoxy composition has a low dielectric loss ratio, improved heat resistance, and improved storage stability.

Imidazole-Based Curing Catalyst

The imidazole-based curing catalyst promotes curing of the bisphenol-based epoxy compound. When using an imidazole-based curing catalyst in combination with an acid anhydride-based curing agent, the catalyst may be poisoned by carbon black which is a component of the carbon/epoxy composition. However, when the imidazole-based curing catalyst is used along with an amine-based curing agent, the poisoning of the catalyst by carbon black may be substantially reduced or effectively prevented, thereby improving the effectiveness of the imidazole-based curing catalyst and the carbon black.

The imidazole-based curing catalyst may promote curing of the bisphenol-based epoxy compound, resulting in a decrease of a dielectric loss ratio of the carbon-epoxy dielectric layer produced from the carbon/epoxy composition.

The imidazole-based curing catalyst may include substituted or unsubstituted C1 to C30 alkyl imidazole, substituted or unsubstituted C6 to C30 aryl imidazole, substituted or unsubstituted C7 to C30 arylalkyl imidazole, or a combination thereof, but is not limited thereto. The imidazole-based curing catalyst may include 1-methyl imidazole, 2-methyl imidazole, 2-ethyl-4-methyl imidazole, 2-isopropyl imidazole, 2-undecyl imidazole, 2-heptadecyl imidazole, 1-phenyl imidazole, 2-phenyl imidazole, 2-phenyl-4-methyl imidazole, or a combination thereof.

The imidazole-based curing catalyst may be included in an amount of about 0.1 wt % to about 3 wt %, in another embodiment about 0.5 wt % to about 2 wt %, and in another embodiment about 0.5 wt % to about 1.5 wt %, based on the total weight of the carbon/epoxy composition. When the imidazole-based curing catalyst is included within the forgoing range, the bisphenol-based epoxy compound is sufficiently cured, and a carbon-epoxy dielectric layer fabricated using the carbon/epoxy composition has a low dielectric loss ratio, improved heat resistance, and improved storage stability.

The amine-based curing agent and the imidazole-based curing catalyst are included in the bisphenol-based composition in a weight ratio of about 10:1 to about 5:1, specifically about 9:1 to about 6:1, more specifically about 8:1 to about 7:1. When the amine-based curing agent and imidazole-based curing catalyst are included in the foregoing the weight ratio, curing is sufficient to lower a dielectric loss ratio, improve dielectric properties, and improve heat resistance.

Carbon Black

The carbon black is a conductive material and has a structure with a high surface area, thus, while not wanting to be bound by theory, it is believed that addition of carbon black improves the dielectric constant of the carbon-epoxy dielectric layer.

The carbon black may have a surface area of equal to or greater than about 300 square meters per liter ($m^2/L$), specifically equal to or greater than about 400 $m^2/L$, more specifically equal to or greater than about 500 $m^2/L$, and may have a dibutylphthalate ("DBP") absorption of equal to or greater than about 1 milliliter per gram (mL/g), specifically equal to or greater than about 2 mL/g, more specifically equal to or greater than 10 mL/g. Non-limiting examples of the carbon black may include KETJEN BLACK EC-300J (manufactured by MITSUBISHI CHEMICAL) or KETJEN BLACK EC-600JD (manufactured by MITSUBISHI CHEMICAL), but are not limited thereto. The carbon black may include any carbon black as long as the surface area and the DBP absorption are within the forgoing range. The carbon black may be included in an amount of about 1 wt % to about 10 wt %, in another embodiment about 1.5 wt % to about 7.5 wt %, and in another embodiment about 3.5 wt % to about 6.5 wt %, based on the total weight of the carbon/epoxy composition. When the amount of carbon black is within the forgoing range, it is possible to optimize the distance between carbon black particles and further improve the dielectric properties. Accordingly, it is beneficial for the carbon black to be included in the foregoing range in order to provide the carbon-epoxy dielectric layer obtained by curing of the carbon/epoxy composition with a high dielectric constant and a low dielectric loss ratio.

Solvent

Non-limiting examples of the solvent may include ethyl acetate, n-butyl acetate, isobutyl acetate, ethyleneglycolmonomethylether acetate, ethyleneglycol n-butylether acetate ("EGBEA"), diethyleneglycoldimethylether, diethyleneglycolmethylethylether, diethyleneglycolethylether acetate, dipropyleneglycol, n-butylether, tripropyleneglycol, n-propylether, tripropylene glycol methylether, propylene glycol methylether acetate, propylene glycol diacetate ("PGDA"), dipropylene glycol monomethylether ("DPGME"), diethylene glycol monoethylether (carbitol), propylene glycol monoethylether acetate, dimethyl formamide ("DMF"), acetone, cyclohexanone, ethyl 3-methoxy propionate, methyl 3-ethoxy propionate, ethyl 3-ethoxy propionate, methyl cellosolve, or a combination thereof, but are not limited thereto. The solvent may be included in an amount sufficient to provide a carbon/epoxy composition having a selected viscosity, which may be a viscosity suitable for coating.

Additional Additives

The carbon/epoxy composition may further optionally include an additive such as a dispersant.

The dispersant may control the agglomeration of carbon black particles. The dispersant may have a hydrophilic group and a hydrophobic group selected to improve control of agglomeration of the carbon black particles. The surface of the carbon black for a carbon/epoxy composition may be pre-treated with a dispersant.

The dispersant may include a urethane-based dispersant, an acryl-based dispersant, or an epoxy-based dispersant, but is not limited thereto.

The urethane-based dispersant includes DISPERBYK 2150 (manufactured by BYK Chemie), DISPERBYK 164 (manufactured by BYK Chemie), DISPERBYK 163 (manufactured by BYK Chemie), or a combination thereof.

The acryl-based dispersant includes DISPERBYK k 2070 (manufactured by BYK Chemie).

The epoxy-based dispersant includes a compound including a repeating unit represented by the following Chemical Formula 3.

Chemical Formula 3

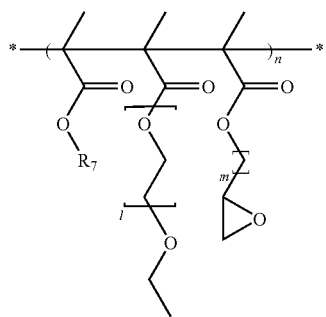

In the above Chemical Formula 3, $R_7$ is a substituted or unsubstituted C1 to C30 alkyl, l is an integer ranging from 1 to about 10, specifically about 2 to about 9, more specifically about 3 to about 7, m is an integer ranging from about 1 to about 10, specifically about 2 to about 9, more specifically about 3 to about 7, and n is an integer ranging from about 2 to about 10, specifically about 3 to about 9, more specifically about 3 to about 7. In an embodiment, m is 1. The epoxy-based dispersant includes a compound including a repeating unit represented by the following Chemical Formula 4.

Chemical Formula 4

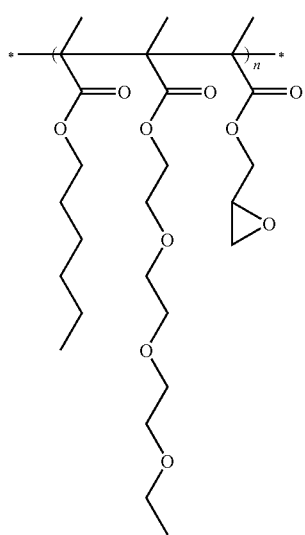

In the above Chemical Formula 4, n is an integer ranging from about 2 to about 10, specifically about 3 to about 9, more specifically about 3 to about 7.

The dispersant may be included in an amount of about 10 parts by weight to about 150 parts by weight, in another embodiment about 30 parts by weight to about 100 parts by weight, and in another embodiment about 40 parts by weight to about 100 parts by weight, based on 100 parts by weight of the carbon black. When the dispersant is included in the foregoing range, it is possible to facilitate dispersion of the carbon black and to control the agglomeration of carbon black particles.

According to another embodiment, a carbon-epoxy dielectric layer obtained using the carbon/epoxy composition is provided.

The carbon-epoxy dielectric layer may be obtained by forming a layer comprising the carbon/epoxy composition (e.g., by coating the composition) and curing the carbon/epoxy composition.

Exemplary methods of coating the carbon/epoxy composition include tape casting, tape printing, spin coating, roll coating, screen printing, or inkjet printing, but is not limited thereto.

The curing may be performed under conditions sufficient to cure the carbon/epoxy composition. The extent of curing may be characterized by thermogravimetric analysis ("TGA") and/or differential scanning calorimetry ("DSC"). As used herein, $T_1$ refers to a temperature after an exothermal peak in a TGA and/or DSC curve, and a curing temperature may be T1±10° C. As used herein, the notation "±10° C." means that the indicated measurement may be from an amount that is minus 10% to an amount that is plus 10% of the stated value. The temperature $T_1$ is after an exothermal peak, and refers to the temperature of the carbon/epoxy composition, as observed by TGA and/or DSC.

The curing may be performed at about 150° C. to about 220° C., specifically about 160° C. to about 210° C., more specifically about 170° C. to about 200° C. for about 0.5 to about 2 hours, specifically about 0.9 to about 1.5 hours, more specifically about 1 hour, but is not limited thereto. When the carbon/epoxy composition is cured under the foregoing conditions, the epoxy compound is sufficiently cured and has a thermal stability sufficient to provide a carbon-epoxy dielectric layer uniformly having a high dielectric constant and a low dielectric loss ratio.

The carbon-epoxy dielectric layer may have a thickness of about 1 micrometer (μm) to about 30 μm, specifically about 2 μm to about 25 μm, more specifically about 5 μm to about 20 μm. When the carbon-epoxy dielectric layer has a thickness within the forgoing range, it is possible to decrease the electrical current loss, and the carbon-epoxy dielectric layer may be easily mounted in the embedded semiconductor device. The thickness of the carbon-epoxy dielectric layer may be controlled by selecting the amount of the bisphenol-based epoxy compound.

According to another embodiment, a semiconductor device including the carbon-epoxy dielectric layer is provided. The carbon-epoxy dielectric layer has a low dielectric loss ratio, so as to provide improved dielectric properties, improved heat resistance, and improved storage stability. The carbon-epoxy dielectric layer may be utilized as one part of a semiconductor device, but is not limited thereto. The carbon-epoxy dielectric layer may be utilized in various fields requiring a dielectric material.

Non-limiting examples of the semiconductor device include a capacitor, and particular examples of the capacitor may include a decoupling capacitor and a radio frequency ("RE") module capacitor. The semiconductor device may also be an embedded capacitor.

Hereinafter, exemplary embodiments are further illustrated with reference to examples. The following are exemplary embodiments and are not limiting.

EXAMPLES

Example 1

Carbon/Epoxy Composition and a Capacitor Including a Carbon-Epoxy Dielectric Layer Produced Using the Same

A 0.105 gram (g) amount of KETJEN BLACK EC-300J (MITSUBISHI CHEMICAL) is added to 50 g of ethyl acetate and then treated with ultrasonication for 30 minutes to provide a carbon black dispersion.

In another container, 1.577 g of bisphenol A diglycidyl ether ("DGEBA"), 0.246 g of dicyandiamide ("DICY"), and 0.015 g of 1-methyl imidazole are added to 10 g of ethyl acetate, and mixed with a magnetic stirrer for 30 minutes to provide an epoxy solution.

The obtained carbon black dispersion and the obtained epoxy solution are put into a container, and then mixed with a magnetic stirrer for 30 minutes. Then the mixture of the carbon black dispersion and the epoxy solution is agitated for 3 minutes using a homogenizer and then treated with ultrasonication for 3 minutes three times. Then, evaporation is performed at 32° C. under vacuum to remove ethyl acetate to provide a carbon/epoxy composition having a viscosity of 100,000 centipoise (cps).

The obtained carbon/epoxy composition is tape-cast on a copper clad laminate ("CCL") to provide a carbon/epoxy composition film.

The carbon/epoxy composition film positioned on the CCL is heated from room temperature to 80° C. at a rate of 10° C. per minute (° C./min) and maintained at 80° C. for 1 hour. Then, the carbon/epoxy composition film is heated to 200° C. at a rate of 10° C./min, maintained at 200° C. for 1 hour, and then cooled by ambient convection to provide a carbon-epoxy dielectric layer. The carbon-epoxy dielectric layer formed on the CCL has a thickness of 20 μm.

A gold (Au) top electrode is deposited on the carbon-epoxy dielectric layer using direct current ("DC") sputtering to provide a capacitor including the carbon-epoxy dielectric layer.

Example 2

Carbon/Epoxy Composition and a Capacitor Including a Carbon-Epoxy Dielectric Layer Produced Using the Same

A capacitor is fabricated according to the same method as in Example 1, except that 0.015 g of 2-methyl imidazole is used instead of 0.015 g of 1-methyl imidazole to provide a carbon/epoxy composition and a carbon-epoxy dielectric layer produced using the same.

The carbon-epoxy dielectric layer formed on the CCL has a thickness of 20 μm.

Example 3

Carbon/Epoxy Composition and a Capacitor Including a Carbon-epoxy Dielectric Layer Produced Using the Same

A 0.105 g amount of KETJEN BLACK EC-300J (MITSUBISHI CHEMICAL) and 0.0735 g of the epoxy-based dispersant including a repeating unit represented by the above Chemical Formula 4 are added to 50 g of ethyl acetate, and then treated with ultrasonication for 30 minutes to provide a carbon black dispersion.

In a container, 1.577 g of bisphenol A diglycidyl ether ("DGEBA"), 0.246 g of dicyandiamide ("DICY"), and 0.015 g of 1-methyl imidazole are added to 10 g of ethyl acetate, and mixed with a magnetic stirrer for 30 minutes to provide an epoxy solution.

The obtained carbon black dispersion and the obtained epoxy solution are put into a container, and then mixed with a magnetic stirrer for 30 minutes. Then, mixture of the carbon black dispersion and epoxy solution is agitated for 3 minutes using a homogenizer and then treated with ultrasonication for 3 minutes three times. Then, evaporation is performed at 32° C. under vacuum to remove ethyl acetate to provide a carbon/epoxy composition having a viscosity of 100,000 cps.

The obtained carbon/epoxy composition is tape-cast on a copper clad laminate ("CCL") to provide a carbon/epoxy composition film.

The carbon/epoxy composition film positioned on the CCL is heated from room temperature to 80° C. at a rate of 10° C./min and maintained at 80° C. for 1 hour. Then, it is heated to 200° C. at a rate of 10° C./min and maintained at 200° C. for 1 hour, and then is cooled by ambient convection to provide a carbon-epoxy dielectric layer. The carbon-epoxy dielectric layer formed on the CCL has a thickness of 20 μm.

A gold (Au) top electrode is deposited on the carbon-epoxy dielectric layer using direct current ("DC") sputtering to provide a capacitor including the carbon-epoxy dielectric layer.

Example 4

Carbon/Epoxy Composition and a Capacitor Including a Carbon-Epoxy Dielectric Layer Produced Using the Same

A capacitor is fabricated according to the same method as in Example 3, except that 0.015 g of 2-methyl imidazole is used instead of 0.015 g of 1-methyl imidazole to provide a carbon/epoxy composition and a carbon-epoxy dielectric layer produced using the same.

The carbon-epoxy dielectric layer formed on the CCL has a thickness of 20 μm.

Comparative Example 1

Carbon/Epoxy Composition and a Capacitor Including a Carbon-Epoxy Dielectric Layer Produced Using the Same

A capacitor is fabricated according to the same method as in Example 3, except that 0.764 g of hexahydrophthalic anhydride is used instead of 0.246 g of dicyandiamide ("DICY") to provide a carbon/epoxy composition and a carbon-epoxy dielectric layer produced using the same.

The carbon-epoxy dielectric layer formed on the CCL has a thickness of 20 μm.

Comparative Example 2

Carbon/Epoxy Composition and a Capacitor Including a Carbon-Epoxy Dielectric Layer Using the Same

A capacitor is fabricated according to the same method as in Example 1, except that 0.015 g of 1-methyl imidazole is not used to provide a carbon/epoxy composition and a carbon-epoxy dielectric layer produced using the same.

The carbon-epoxy dielectric layer formed on the CCL has a thickness of 20 μm.

Experimental Example 1

Measurement of Exothermic Temperature

The exothermic temperatures of the cured carbon/epoxy compositions according to Examples 1 to 4, and Comparative Example 1 and 2 are measured using thermogravimetric analysis ("TGA") and differential scanning calorimeter ("DSC"). The temperature at which the final exothermal peak in a TGA/DSC curved line is observed is referred to as an exothermic temperature of the carbon/epoxy composition. The results are shown in the following Table 1.

Experimental Example 2

Measurement of Curing Heat

The curing heats of the carbon/epoxy compositions according to Examples 1 to 4, and Comparative Examples 1 and 2 are calculated from the TGA/DSC curve. The areas of the exothermic peaks in the DSC curve correspond to exothermic heats. The results are shown in the following Table 1.

Experimental Example 3

Measurement of Glass Transition Temperature

The glass transition temperatures of the carbon/epoxy compositions according to Examples 1 to 4, and Comparative Examples 1 and 2 are measured by DSC. The results are shown in the following Table 1.

Experimental Example 4

Evaluation of Dielectric Properties

Dielectric loss ratios (tan δ, having the unit percent (%)) of the capacitors including the carbon-epoxy dielectric layers fabricated according to Examples 1 to 4, and Comparative Examples 1 and 2 are measured by a metal-insulator-metal ("MIM") method. The results are shown in the following Table 1.

TABLE 1

| Specimen Nos. | Exothermic temperature (° C.) | Curing heat (J/g) | Glass transition temperature (° C.) | Dielectric loss ratio (%) |
|---|---|---|---|---|
| Example 1 | 149.0 | 198 | 91.5 | 8 |
| Example 2 | 153.7 | 340.7 | 100.4 | 6 |
| Example 3 | 136.0 | 478.2 | 107 | 5 |
| Example 4 | 134.5 | 480.4 | 108.4 | 5 |
| Comparative Example 1 | 115.6 | 234.5 | 87.1 | 45 |
| Comparative Example 2 | 120.8 | 223.4 | 85.2 | 56 |

J/g refers to Joules per gram

Comparing the exothermic temperatures of Examples 1 to 4 and Comparative Examples 1 and 2, the exothermic temperatures of Examples 1 to Example 4 are higher than those of Comparative Examples 1 and 2. From the results, it can be concluded that the curing of the carbon/epoxy composition according to Examples 1 to 4 is latent thermal curing.

The curing heat of Example 1 is lower than those of Comparative Examples 1 and 2 while the curing heats of Examples 2 to 4 are higher than those of Comparative Examples 1 and 2. From these results it can be concluded that the carbon/epoxy compositions of Examples 1 to 4 generally have an excellent degree of curing.

The glass transition temperatures of Examples 1 to 4 are higher than those of Comparative Examples 1 and 2. From these results, it can be concluded that the carbon/epoxy compositions according to Examples 1 to 4 are efficiently cured to provide polymers having improved heat resistance.

The dielectric loss ratios of the capacitors including the carbon-epoxy dielectric layers according to Examples 1 to 4 are lower than those of Comparative Examples 1 and 2.

These results show that combination of the amine-based curing agent and an imidazole-based curing catalyst prevents the imidazole-based curing catalyst from being poisoned by carbon black, and a degree of curing of the epoxy compound is increased.

The capacitors including the carbon-epoxy dielectric layers according to Examples 1 to 4 have excellent heat resistance and low dielectric loss ratio, resulting in excellent dielectric properties.

While this invention has been described in connection with exemplary embodiments, it is to be understood that the invention is not limited to the disclosed embodiments, but, on the contrary, is intended to cover various modifications and equivalent arrangements included within the spirit and scope of the appended claims.

What is claimed is:

1. A carbon/epoxy composition, comprising:
   a bisphenol-based epoxy compound having at least two epoxy groups;
   an amine-based curing agent, wherein the amine-based curing agent is a cyano-substituted amine;
   an imidazole-based curing catalyst; and
   carbon black,
   wherein the carbon/epoxy composition comprises about 60 to about 90 weight percent of the bisphenol-based epoxy compound, about 1 to about 30 weight percent of the amine-based curing agent, about 0.1 to about 3 weight percent of the imidazole-based curing catalyst, and about 1 to about 10 weight percent of the carbon black; and
   wherein a weight ratio of the amine-based curing agent to the imidazole-based curing catalyst is about 10:1 to about 5:1.

2. The carbon/epoxy composition of claim 1, wherein the bisphenol-based epoxy compound comprises a bisphenol A epoxy compound, a bisphenol F epoxy compound, a bisphenol AF epoxy compound, or a combination thereof.

3. The carbon/epoxy composition of claim 2, wherein the bisphenol epoxy compound is represented by the following Chemical Formula 1:

Chemical Formula 1

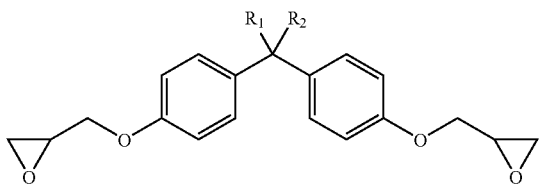

wherein R₁ and R₂ are the same or different and each of R₁ and R₂ is hydrogen, a substituted or unsubstituted alkyl, or hydroxyl.

4. The carbon/epoxy composition of claim 3, wherein the bisphenol epoxy compound comprises bisphenol A diglycidyl ether.

5. The carbon/epoxy composition of claim 1, wherein the amine-based curing agent is represented by the following Chemical Formula 2:

Chemical Formula 2

wherein R₃ to R₆ are the same or different, and independently are hydrogen, a substituted or unsubstituted C1 to C30 alkyl, a substituted or unsubstituted C2 to C30 alkenyl, a substituted or unsubstituted C2 to C30 alkynyl, a substituted or unsubstituted C1 to C30 alkoxy, a substituted or unsubstituted C3 to C30 cycloalkyl, a substituted or unsubstituted C3 to C30 cycloalkenyl, a substituted or unsubstituted C3 to C30 cycloalkynyl, a substituted or unsubstituted C6 to C30 aryl, a substituted or unsubstituted C2 to C30 heteroaryl, a substituted or unsubstituted C6 to C30 arylalkyl, a substituted or unsubstituted C2 to C30 heterocyclic group, or a combination thereof.

6. The carbon/epoxy composition of claim 1, wherein the amine-based curing agent is dicyandiamide.

7. The carbon/epoxy composition of claim 6, wherein the imidazole-based curing catalyst comprises 1-methyl imidazole, 2-methyl imidazole, 2-ethyl-4-methyl imidazole, 2-isopropyl imidazole, 2-undecyl imidazole, 2-heptadecyl imidazole, 1-phenyl imidazole, 2-phenyl imidazole, 2-phenyl-4-methyl imidazole, or a combination thereof.

8. The carbon/epoxy composition of claim 1, wherein the imidazole-based curing catalyst comprises a substituted or unsubstituted C1 to C30 alkyl imidazole, a substituted or unsubstituted C6 to C30 aryl imidazole, a substituted or unsubstituted C7 to C30 arylalkyl imidazole, or a combination thereof.

9. The carbon/epoxy composition of claim 1, wherein the carbon/epoxy composition further comprises about 10 to about 100 parts by weight of a dispersant, based on 100 parts by weight of the carbon black.

10. The carbon/epoxy composition of claim 1, wherein the amine-based curing agent further comprises diethylene triamine, triethylene tetraamine, diethylamino propylamine, menthane diamine, N-aminoethyl piperazine, meta-xylene diamine, isophorone diamine, or a combination thereof.

11. A carbon-epoxy dielectric layer, comprising:
a cured reaction product of a carbon/epoxy composition, the carbon/epoxy composition comprising
a bisphenol epoxy compound comprising at least two epoxy groups;
an amine-based curing agent, wherein the amine-based curing agent is a cyano-substituted amine;
an imidazole-based curing catalyst; and
carbon black;
wherein the carbon/epoxy composition comprises about 60 to about 90 weight percent of the bisphenol-based epoxy compound, about 1 to about 30 weight percent of the amine-based curing gent, about 0.1 to about 3 weight percent of the imidazole-based curing catalyst, and about 1 to about 10 weight percent of the carbon black; and
wherein a weight ratio of the amine-based curing agent to the imidazole-based curing catalyst is about 10:1 to about 5:1.

12. A semiconductor device, comprising:
a carbon-epoxy dielectric layer, wherein the carbon-epoxy dielectric layer comprises a cured reaction product of a carbon/epoxy composition comprising
a bisphenol epoxy compound comprising at least two epoxy groups;
an amine-based curing agent, wherein the amine-based curing agent is a cyano-substituted amine;
an imidazole-based curing catalyst; and
carbon black,
wherein the carbon/epoxy composition comprises about 60 to about 90 weight percent of the bisphenol-based epoxy compound, about 1 to about 30 weight percent of the amine-based curing agent, about 0.1 to about 3 weight percent of the imidazole-based curing catalyst, and about 1 to about 10 weight percent of the carbon black; and
wherein a weight ratio of the amine-based curing agent to the imidazole-based curing catalyst is about 10:1 to about 5:1.

13. The semiconductor device of claim 12, wherein the semiconductor device is an embedded capacitor.

* * * * *